(12) United States Patent
Qi et al.

(10) Patent No.: US 9,723,745 B2
(45) Date of Patent: Aug. 1, 2017

(54) LINE CARD EJECTOR WITH LINE CARD REMOVAL INDICATION

(71) Applicant: Cisco Technology, Inc., San Jose, CA (US)

(72) Inventors: Wei Qi, Shanghai (CN); Jiayou Meng, Shanghai (CN)

(73) Assignee: Cisco Technology, Inc., San Jose, CA (US)

( * ) Notice: Subject to any disclaimer, the term of this patent is extended or adjusted under 35 U.S.C. 154(b) by 118 days.

(21) Appl. No.: 14/623,480

(22) Filed: Feb. 16, 2015

(65) Prior Publication Data

US 2016/0242307 A1    Aug. 18, 2016

(51) Int. Cl.
*H05K 7/14* (2006.01)
*G06F 1/18* (2006.01)

(52) U.S. Cl.
CPC ............. *H05K 7/1489* (2013.01); *G06F 1/18* (2013.01); *H05K 7/1409* (2013.01)

(58) Field of Classification Search
CPC .............. H05K 7/1407; H05K 7/1489; H05K 7/20709; H05K 7/1404; H05K 7/1401; H05K 7/1411; H05K 7/1412; H05K 7/1415; H05K 7/1421; H05K 7/1485; H05K 7/1487; H05K 7/1488; H01R 13/62994
See application file for complete search history.

(56) References Cited

U.S. PATENT DOCUMENTS

| | | | |
|---|---|---|---|
| 5,959,834 A * | 9/1999 | Chang ................. | G11B 33/025 361/679.31 |
| 5,959,843 A * | 9/1999 | Kurrer ................ | H05K 7/1409 200/292 |
| 6,141,711 A | 10/2000 | Shah et al. | |
| 6,678,775 B1 | 1/2004 | Zink | |
| 6,731,832 B2 | 5/2004 | Alvarez et al. | |
| 6,735,089 B1 * | 5/2004 | Byers .................. | H05K 7/1409 361/747 |
| 6,952,349 B2 * | 10/2005 | Gough ............... | H05K 7/20736 361/741 |
| 6,961,249 B2 * | 11/2005 | Wong ................. | H05K 7/1414 361/754 |
| 7,382,623 B2 * | 6/2008 | Hartman ............. | H05K 7/1421 211/162 |
| 7,874,776 B1 * | 1/2011 | Lam .................... | H05K 7/1407 411/180 |
| 8,001,313 B2 | 8/2011 | Eggers et al. | |

(Continued)

*Primary Examiner* — Courtney Smith
*Assistant Examiner* — Michael Matey
(74) *Attorney, Agent, or Firm* — Squire Patton Boggs (US) LLP

(57) ABSTRACT

In one implementation, an apparatus includes a securing component configured to attach the line card ejector to a chassis of a network communication device, prevent removal of a line card from the chassis when the securing component is in a first configuration, and allow removal of the line card from the chassis when the securing component is in a second configuration. The apparatus also includes an ejection component configured to facilitate insertion and removal of the line card from the chassis of the network communication device. The apparatus further includes a sensor component configured to detect an imminent removal of the line card from the chassis of the network communication device.

16 Claims, 6 Drawing Sheets

(56) References Cited

U.S. PATENT DOCUMENTS

| | | | | |
|---|---|---|---|---|
| 8,179,680 | B1* | 5/2012 | Lam | H05K 7/1409 361/726 |
| 2003/0072139 | A1* | 4/2003 | Yamaguchi | H05K 7/1407 361/759 |
| 2004/0242039 | A1* | 12/2004 | Griffin | H05K 7/1409 439/157 |
| 2006/0067063 | A1* | 3/2006 | Stahl | H05K 7/1409 361/754 |
| 2007/0258224 | A1* | 11/2007 | Fang | H05K 7/1409 361/759 |
| 2011/0279973 | A1* | 11/2011 | Terwilliger | H05K 7/1489 361/679.58 |
| 2013/0241377 | A1* | 9/2013 | Zhang | H05K 5/0221 312/223.2 |
| 2014/0187068 | A1* | 7/2014 | Chia | H05K 7/1489 439/160 |
| 2015/0359125 | A1* | 12/2015 | Ehlen | H05K 7/1409 361/754 |

\* cited by examiner

LINE CARD EJECTOR WITH LINE CARD REMOVAL INDICATION

TECHNICAL FIELD

The present disclosure relates to line cards. In particular, the present disclosure relates to a line card ejector for a line card.

BACKGROUND

Network communication devices may be used to transmit and/or receive data between various computing devices (e.g., server computers, desktop computers, laptop computers, tablet computers, databases, etc.), other network communication devices, and/or networks (e.g., public networks such as the Internet and/or private networks such as local area networks (LANs) or virtual private networks (VPNs)). Examples of network communication devices include, but are not limited to, network switches, network routers, network hubs, blade switches, etc. The network communication devices may include one or more slots to receive one or more line cards. A line card may include one or more electronic circuits on a printed circuit board (PCB). For example, the line card may include one or more processing devices (e.g., processors, application specific integrated circuits (ASICs), field-programmable gate arrays (FPGAs)), a flash memory, a random access memory, etc. The one or more line cards may be coupled to data and/or power interfaces (e.g., ports, communication lines, power lines, bus lines, etc.) in the network communication device. For example, the one or more line cards may be coupled to a backplane of the network communication device. This may allow the one or more line cards to receive power from the network communication device and/or transmit/receive data from the network communication device. A line card may allow a network communication device to interface and/or communicate with other communications devices and/or networks.

BRIEF DESCRIPTION OF THE FIGURES

The present disclosure will be understood more fully from the detailed description given below and from the accompanying drawings of some embodiments and/or illustrative implementations of the present disclosure, which, however, should not be taken to limit the present disclosure to the specific embodiments, but are for explanation and understanding only.

Figure 1:
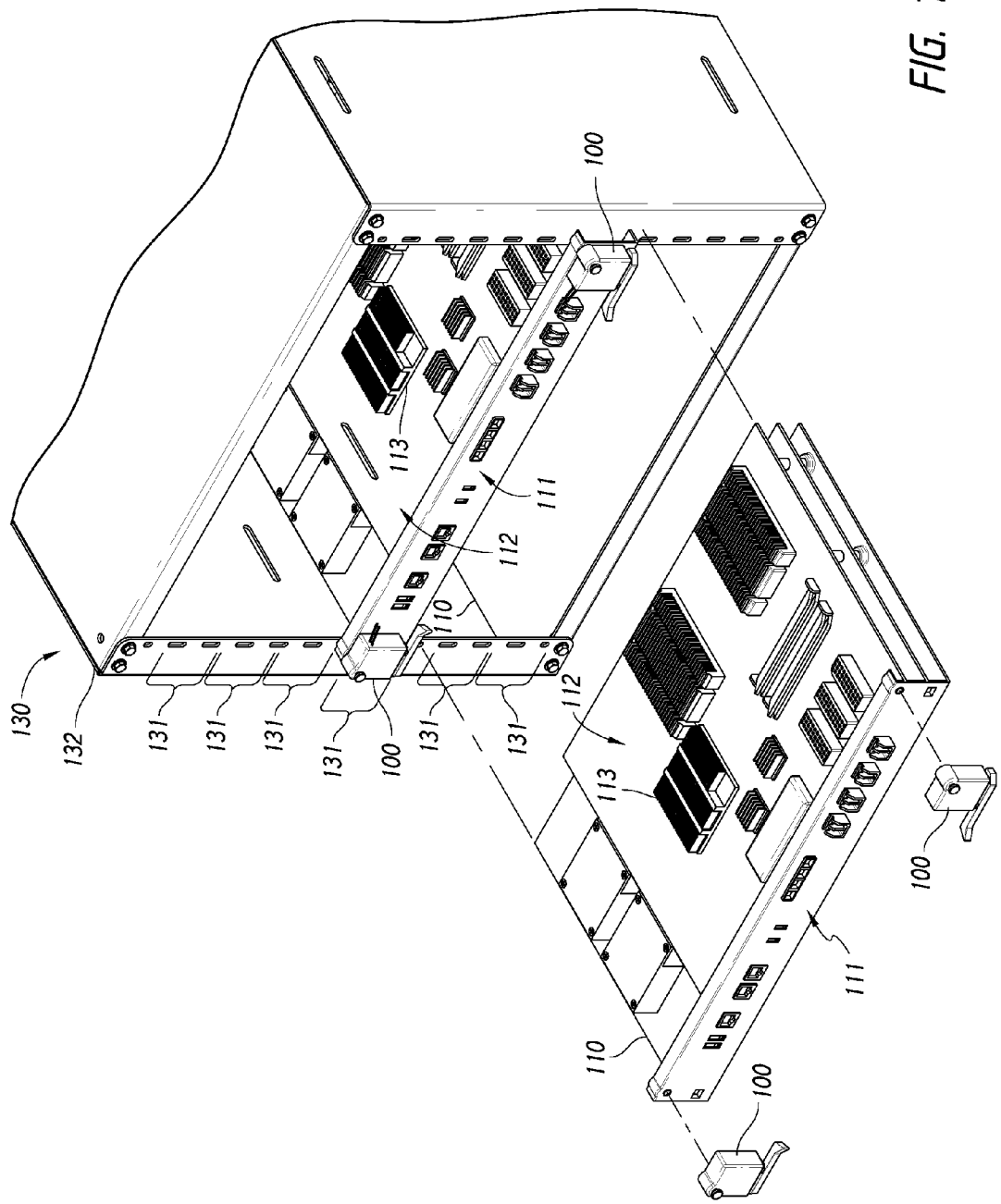
FIG. 1 is a diagram illustrating an example network communication device, according to one embodiment of the present disclosure.

In accordance with common practice, various features shown in the drawings may not be drawn to scale as the dimensions of various features may be arbitrarily expanded or reduced for clarity. Moreover, the drawings may not depict all of the aspects and/or variants of a given system, method and/or device disclosed by the present disclosure. Finally, like reference numerals may be used to denote like features throughout the specification and figures.

DESCRIPTION OF EXAMPLE EMBODIMENTS

Numerous details are described herein in order to provide a thorough understanding of the illustrative implementations shown in the accompanying drawings. However, the accompanying drawings show only some example aspects of the present disclosure and are therefore not to be considered limiting. Those of ordinary skill in the art will appreciate from the present disclosure that other effective aspects and/or variants do not include all of the specific details described herein. Moreover, well-known systems, methods, components, devices and circuits have not been described in exhaustive detail so as not to unnecessarily obscure more pertinent aspects of the implementations described herein. Thus, the specific details set forth are merely examples. Particular implementations may vary from these example details and still be contemplated to be within the scope of the present disclosure.

Overview

Various implementations disclosed herein include apparatuses, systems, and methods for providing and/or operating a line card ejector. For example, in some implementations, an apparatus includes a securing component configured to attach the line card ejector to a chassis of a network communication device, prevent removal of a line card from the chassis when the securing component is in a first configuration, and allow removal of the line card from the chassis when the securing component is in a second configuration. The apparatus also includes an ejection component configured to facilitate insertion and removal of the line card from the chassis of the network communication device. The apparatus further includes a sensor component configured to detect an imminent removal of the line card from the chassis of the network communication device.

In other implementations, a method includes aligning a line card ejector with a slot of a chassis of a network communication device. The line card ejector includes a securing component, an ejection component, and a sensor component. The method also includes placing the ejection component in first configuration where the first configuration facilitates insertion of the line card into the slot of the chassis. The method further includes placing the securing component in second configuration where the second configuration prevents removal of the line card from the slot in the chassis and where the second configuration activates a switch of the sensor component. The sensor component is configured to detect an imminent removal of the line card from the slot of the chassis

DETAILED DESCRIPTION

FIG. 1 is a diagram illustrating an example network communication device 130, according to one embodiment of the present disclosure. The network communication device 130 may be a device that may transmit and/or receive data between various computing devices (e.g., server computers, desktop computers, laptop computers, tablet computers, databases, etc.), other network communication devices (e.g., other network switches/routers), and/or networks (e.g., public networks such as the Internet and/or private networks such as local area networks (LANs) or virtual private networks (VPNs)). Examples of network communication devices may include, but are not limited to, network switches, network routers, network hubs, blade switches, etc.

As illustrated in FIG. 1, the network communication device 130 includes a chassis 132 and the chassis includes plurality of slots 131. The slots 131 illustrated in FIG. 1 are arranged horizontally in the chassis 132. It shall be understood that the number and/or arrangement of the slots 131 illustrated in FIG. 1 are merely examples. In other embodiments, the network communication device 130 may include any number of slots 131 and/or the slots 131 may be arranged in various layouts. For example, the slots 131 may be arranged vertically in the chassis 132.

Each of the slots 131 may be configured to receive a line card 110. As discussed above, the line card 110 includes a front panel 111 and one or more electronic circuits on a printed circuit board (PCB) 112. For example, as illustrated in FIG. 1, the line card 110 includes a processor 113 (e.g., ASIC, FPGA, processing device, etc.) mounted on the PCB 112. The line card 110 may allow a network communication device to interface and/or communicate with other communications devices and/or networks. For example, the line card 110 may include a plurality of ports configured to receive pluggable transceiver modules (e.g., small form-factor pluggable (SFP) transceiver modules, optical transceiver modules, copper transceiver modules, etc.), cables, and/or cable connectors. The network communication device 130 may use the line card 110, the ports, and/or pluggable transceiver modules to interface and/or communicate with other communications devices and/or networks.

As discussed above, the line card 110 may be inserted into one of the slots 131 of the chassis 132 of the network communication device 130. For example, as illustrated by the dashed lines in FIG. 1, the line card may be inserted into the fourth slot (from the top of the chassis 132) of the network communication device 130. Line card ejectors 100 may be used to secure the line card 110 in the slot 131. For example, the line card ejectors 100 may be used to help prevent the removal of the line card 110 from the slot 131 (as discussed in more detail below). The line card ejector 100 may also be used to facilitate the insertion and/or the removal of the line card 110 and/or the line card ejector 100 from the slot 131. For example, the line card ejectors 100 may be used to help a user insert and/or remove the line card 110 from the slot 131 (as discussed in more detail below).

Removing a line card from the chassis while the line card is still in operation may cause damage to the line card and/or may corrupt the data stored in a memory (e.g., flash memory) of the line card (e.g., may cause errors in the data and/or files stored in the memory). In some embodiments, the line card ejector 100 may provide a signal to the line card to indicate an imminent removal of the line card from network communication device 130 prior to the removal of the line card. This may allow the line card to perform one or more shutdown operations (as discussed in more detail below). The shutdown operations may help prevent damage to the components of the line card. The shutdown operations may also help prevent corruption of data (or files) stored in a memory of the line card.

Although the line card ejector 100 may be illustrated as separate from the line card 110 (e.g., may be physically separable from the line card 110) in the figures, it shall be understood that in other embodiments, the line card ejector 100 may be part of the line card 110 (e.g., may not be physically separable from the line card 110). For example, the line card ejector 100 may be a component of the line card 110. In one embodiment, the line card ejector 100 may be sold and/or provided to a consumer/user along with the line card 110. In one embodiment, a first line card ejector 100 may be a mirror image of a second line card ejector 100. For example, the line card ejector 100 on the left may be a mirror image of the line card ejector 100 on the right.

Figures 2, 3:
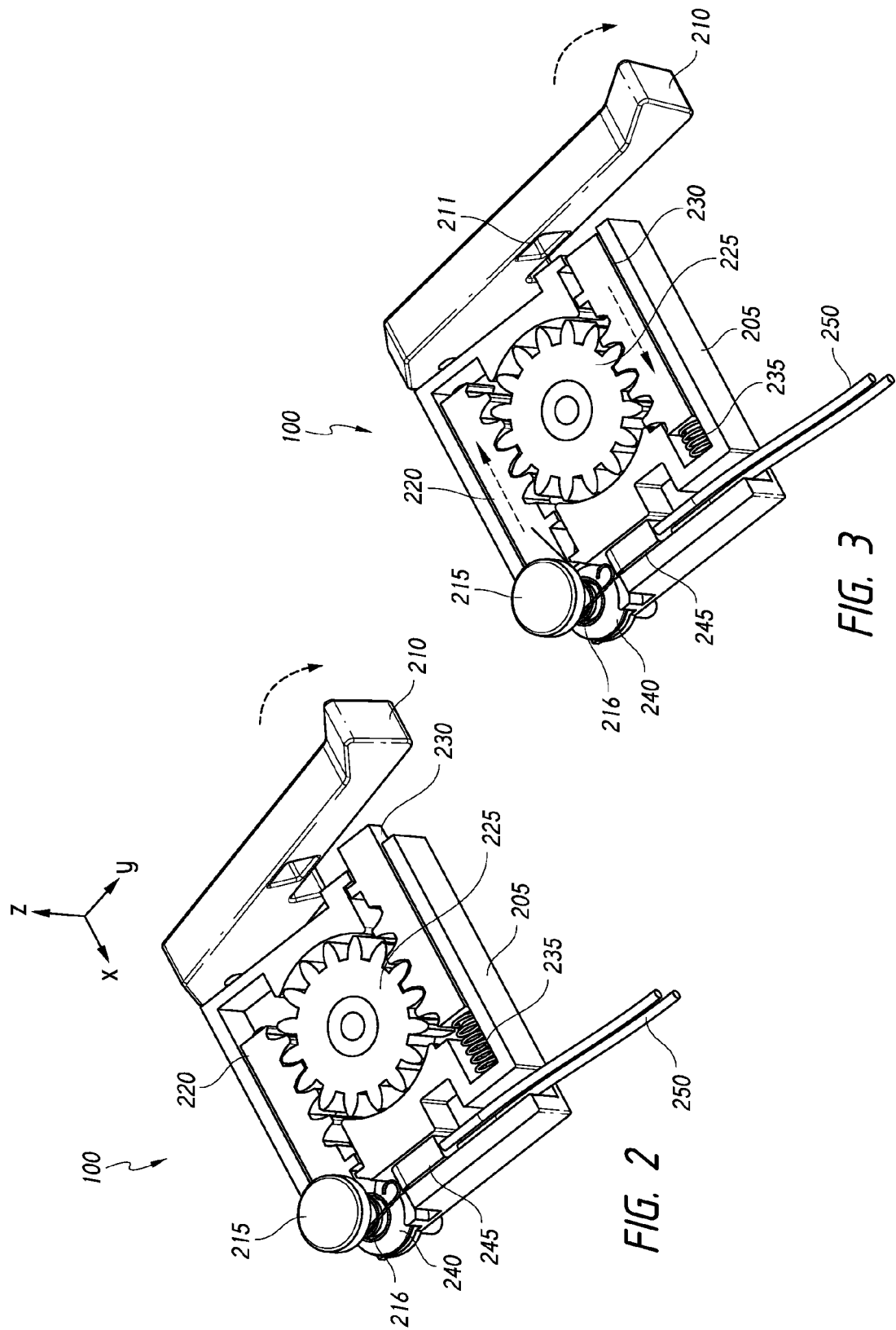
FIG. 2 is a diagram illustrating a cutaway perspective view of a line card ejector, according to one embodiment of the present disclosure.
FIG. 3 is a diagram illustrating a cutaway perspective view of a line card ejector, according to one embodiment of the present disclosure.

FIG. 2 is a diagram illustrating a cutaway perspective view of a line card ejector 100, according to one embodiment of the present disclosure. The line card ejector 100 includes a housing 205. The housing 205 may be constructed using various types of materials. For example, the housing 205 may be constructed using one or more of plastics, polymers, metals (e.g., steel, aluminum, etc.), and metal alloys. The housing 205 may have a form factor that allows the line card ejector 100 to secure and/or prevent the removal of a line card (e.g., line card 110 illustrated in FIG. 1) from a slot (e.g., slot 131 illustrated in FIG. 1) of a network communication device (e.g., network communication device 130). For example, the housing 205 may have dimensions (e.g., height, width, length) and/or a shape that allows the line card ejector 100 to be aligned with a slot of the network communication device and to help prevent the removal of a line card from the slot of the network communication device.

The line card ejector 100 includes a second movable slider 220, a first movable slider 230, a gear 225, and a first spring 235 disposed within the housing 205. The second movable slider 220 and the first movable slider 230 may include a plurality of teeth (e.g., cogs, protrusions, etc.) that are configured to cooperate (e.g., interface) with a plurality of teeth on the gear 225. For example, a tooth on the second movable slider 220 may be configured to fit between (e.g., to be inserted between) two teeth on the gear 225. Moving the first movable slider 230 may cause the second movable slider 220 and/or the gear 225 to move. For example, if the movable first slider 230 moves (e.g., slides) towards the left, the teeth in the first movable slider 230 may engage and/or interface with the teeth of the gear 225 and may cause the gear 225 to rotate clockwise. As the gear 225 rotates clockwise, the teeth of the gear 225 may also engage and/or interface with the teeth of the second movable slider 220, causing the second movable slider 220 to move (e.g., slide) towards the right. In another example, the gear 225 may rotate counter-clockwise and the second movable slider 220 may move toward the left when the first movable slider 230 is moved towards the right.

The first movable slider 230 may cooperate (e.g., interface) with the first spring 235. The first spring 235 may push the first movable slider 230 towards the right (as illustrated in FIG. 2) and may cause the first movable slider 230 to move and/or transition to an extended state/configuration when the first spring 235 is in a relaxed state (e.g., an uncompressed or less compress stated) as illustrated in FIG. 1. When the first movable slider 230 is moved (e.g., pushed) towards the left (e.g., when a pressure and/or force is exerted on the first movable slider 230), the first movable slider 230 may move and/or transition to a second state and/or configuration (e.g., a retracted state/configuration). The movement of the first movable slider 230 may cause the first spring 235 to transition to a compressed state (as illustrated in FIG. 3).

The line card ejector 100 also includes an ejection component 210. In one embodiment, the ejection component 210 may be a lever or a handle. The ejection component 210 may be rotatable about and axis of the line card ejector 100. For example, the ejection component 210 may be rotatable about the X-axis of the housing 205 of the line card ejector 100. In one embodiment, the ejection component 210 (e.g., handle/lever) may be used to facilitate the insertion of the line card and/or the line card ejector 100 into the slot of the network communication device. For example, the ejection component 210 may include notches, tabs, grooves, openings, etc., that may cooperate (e.g., interface) with notches, tabs, grooves, openings, etc., of the chassis. The movement of the ejection component 210 may help push the line card into the slot in the chassis and may help attach the line card ejector 100 to the chassis. In another embodiment, the ejection component 210 may be used to facilitate the removal of the line card from the slit of the network communication device. For example, the movement of the ejection component 210 may help push the line card ejector 100 away from the chassis (e.g., may disconnect the line card from the backplane of the network communication device) and/or may allow the line card ejector 100 to be unattached (e.g., removed) from the chassis. The ejection component 210 also includes an opening 211 (e.g., a hole, a void, a notch, a gap, an aperture, etc.). The opening 211 may be configured to receive at least a portion of the first movable slider 230. For example, at least a portion of the first movable slider 230 may be inserted into the opening 211 (as discussed in more detail below). In other embodiments, the ejection component 210 may be a shaft, an arm, a handgrip, a tab, a bar, a rod, and/or any component that may be used to facilitate the insertion and/or removal of the line card and/or the line card ejector 100 from the slot of the network communication device. The ejection component 210 may be constructed using one or more of plastics, polymers, metals (e.g., steel, aluminum, etc.), and metal alloys.

As illustrated in FIG. 2, the ejection component 210 may be rotated about the X-axis of the line card ejector 100. The ejection component 210 may be rotated downward (e.g., towards the Y-axis) to facilitate the insertion of the line card ejector 100 and/or the line card into the slot of the chassis of the network communication device. For example, the ejection component 210 may be rotated in the direction of the dashed arrow (as illustrated in FIGS. 2 and 3). The ejection component 210 may also be rotated upward (e.g., toward the Z-axis) to facilitate the removal of the line card from the slot of the chassis of the network communication device. For example, the ejection component 210 may be rotated in the direction of the dashed arrows illustrated in FIG. 8. In one embodiment, the ejection component 210 may include one or more of tabs, prongs, notches, ridges, latches, grooves, openings, springs, wheels, gears, and/or other components that may cooperate with the chassis (e.g., may cooperate with tabs, prongs, notches, ridges, latches, grooves, openings, springs, wheels, gears, and/or other components of the chassis) to secure (e.g., inhibit the movement of) the line card ejector 100 and/or the line card to the chassis. The ejection component 210 may be rotated between an open state/configuration and a closed state/configuration. For example, the ejection component 210 may be in an open state/configuration in FIG. 2. The line card ejector 100 may be removable (e.g., uncatchable) from the chassis when the ejection component 210 is in the open state/configuration.

The line card ejector 100 also includes a securing component 215. The securing component 215 may help prevent the removal of the line card from the slot of the chassis (as discussed in more detail below). In one embodiment, the securing component 215 may be a screw that traverses the housing 205 of the line card ejector 100. For example, the securing component may be longer than the depth of the housing 205 (e.g., may be longer than the length of the housing 205 along the Z-axis). In another embodiment, the securing component 215 may be captive screw. For example, the securing component 215 may be a screw that is not removable from the housing 205 of the line card ejector 100. The securing component 215 may be configured to cooperate (e.g., interface) with an opening (e.g., a hole, a void, a notch, a gap, an aperture, etc.) in the chassis of the network communication device. For example, the securing component 215 (e.g., the screw) may include threads (e.g., tracks or grooves) along the length of at least a portion of the securing component 215. The threads may form a helical pattern along the length of the portion of the securing component 215. The threads may be configured to cooperate and/or interface with threads along the surface of the opening of the chassis. The line card ejector 100 also includes a screw nut 240. The screw nut 240 may include an opening and the screw nut 240 may be configured to cooperate and/or interface with the securing component 215 via the opening. For example, the securing component 215 may be inserted through the opening (e.g., hole) in the screw nut 240. The screw nut 240 may be constructed using one or more of plastics, polymers, metals (e.g., steel, aluminum, etc.), and metal alloys.

The line card ejector 100 also includes a second spring 216 that may cooperate with the securing component 215 (e.g., may be wrapped around the length of the securing component 215). The second spring 216 may also cooperate with the screw nut 240 (e.g., may contact and/or apply a force to the screw nut 240). The second spring 216 may assist with a user's manipulation of the securing component 215 (e.g., may push the securing component 215 upwards). The second spring 216 may also exert a force on the screw nut 240 (e.g., may apply and/or exert a downward force on the screw nut 240). In one embodiment, the second spring 216 may be disposed (e.g., placed and/or positioned) within the housing 205. In another embodiment, the second spring 216 may be an optional part of the line card ejector 100 (e.g., the second spring 216 may not be part of the line card ejector 100).

The securing component 215 may transition through various states and/or configurations based on user manipulation (e.g., screwing or unscrewing) of the securing component 215. In one embodiment, the securing component 215 (e.g., the screw) may be placed in (e.g., twisted, screwed, rotated, etc.) a first state/configuration. In the first state/configuration, the securing component 215 may not be in the opening of the chassis of the network communication device. For example, the securing component 215 may be unscrewed from the chassis of the network communication device. A user may operate the ejection component 210 to facilitate the removal of the line card when the securing component 215 is in the first state/configuration. In another embodiment, the securing component 215 may be placed in a second state/configuration. In the second state/configuration, at least a portion of the length of the securing component 215 may remain in the opening of the chassis of the network communication device. The securing component 215 may help prevent the removal of the line card from the slot because at least a portion of the securing component 215 may still be screwed into the opening in the chassis and the housing 205 may prevent a user from removing (e.g., pulling out) the line card. In a further embodiment, the securing component 215 may be placed in a third state/configuration. In the third state/configuration, the securing component 215 may be fully inserted into the opening of the chassis of the network communication device (e.g., to help prevent the removal of the line card from the slot of the chassis).

As discussed above, the sensor component 245 may cooperate with the screw nut 240. For example, the screw nut 240 may contact (e.g., abut, push, etc.) a switch of the sensor component 245 to activate the sensor. In one embodiment, the screw nut 240 may activate a switch of the sensor component 245 when the securing component 215 is in the third state/configuration (as discussed in more detail below). In another embodiment, the screw nut 240 may deactivate a switch of the sensor component 245 when the securing component 215 is in the first or second state/configuration (as discussed in more detail below). The sensor component 245 may be coupled to one or more wires 250. The wires 250 may provide (e.g., transmit) an electrical current, messages, data, and/or signals (e.g., electrical signals or data signals) from the sensor component 245 to the line card. The electrical current, messages, data, and/or signals may indicate an imminent removal of the line card from the slot of the chassis of the network communication device. For example, when the securing component 215 transitions from the third state/configuration to the first or second state/configuration, the sensor component 245 may provide (e.g., transmit or send) a signal to the line card to indicate that the removal of the line card is imminent (as discussed in more detail below).

The line card may perform one or more shutdown operations when the signal and/or other data is received from the sensor component 245. For example, the line card may flush data from a cache or memory of the line card. In another example, the line card may close any files that are open in a memory of the line card (e.g., a flash memory) of the line card to prevent damage to the memory and/or to prevent corruption of data in the memory. In a further example, the line card may power down components of the line card (e.g., power down a circuit, a processor, etc.).

In one embodiment, the line card ejector 100 may allow a line card to be safely removed from the chassis of the network communication device. For example, the sensor component 245 may detect an imminent removal of the line card (as discussed herein) and may provide a signal and/or data to the line card to indicate the imminent removal. This may allow the line card to perform one or more shutdown operations before the line card is removed from the chassis. The shutdown operations may help prevent damage to the components of the line card. The shutdown operations may also help prevent corruption of data (or files) stored in a memory of the line card.

FIG. 3 is a diagram illustrating a cutaway perspective view of a line card ejector 100, according to one embodiment of the present disclosure. As discussed above, the line card ejector 100 includes a second movable slider 220, a first movable slider 230, a gear 225, and a first spring 235 disposed within a housing 205. The second movable slider 220 and the first movable slider 230 are configured to cooperate with the gear 225 and the first spring 235 is configured to cooperate with the first movable slider 230. The line card ejector 100 also includes an ejection component 210 (e.g., a lever or a handle) that may be rotatable about an axis of the line card ejector 100. The ejection component 210 also includes an opening 211 configured to receive at least a portion of the first movable slider 230. The line card ejector 100 further includes a securing component 215, a sensor component 245, a second spring 216, and a screw nut 240 that may cooperate with the securing component 215 and the sensor component 245.

As illustrated in FIG. 3, the ejection component 210 may be rotated downward in the direction illustrated by the dashed arrow. The first movable slider 230 may protrude past the housing 205 of the line card ejector 100 when the first movable slider 230 is in an extended state/configuration. The portion of the first movable slider 230 that may protrude past the housing 205 may be angled and/or curved (e.g., may have a semi-circular shape or a triangular shape). As the ejection component 210 is rotated downward, the ejection component 210 may exert a force (e.g., may contact, push, etc.) against portion of the first movable slider 230 that protrudes past the housing 205 (e.g., against the semi-circular or triangular shaped portion of the first movable slider 230). The force of the downward rotation of the ejection component 210 may cause the first movable slider 230 to move towards the left (as indicated by the dashed arrow of the first movable slider 230) and may also compress the first spring 235 (as illustrated in FIG. 3). The movement of the first movable slider 230 towards the left may cause the gear 225 to rotate clockwise and may also cause the second movable slider 220 to move towards the right (as indicated by the dashed arrow of the second movable slider 220). In one embodiment, the downward rotation of the ejection component 210 may place the movable slider in a retracted state/configuration where the first movable slider 230 does not extend past the housing 205 or a smaller portion of the first movable slider 230 extends past the housing 205.

In one embodiment, the screw nut 240 may be above the second movable slider 220 before the ejection component 210 is rotated downward. As the ejection component 210 is rotated downward and the second movable slider 220 moves towards the right (due to the motion of the gear 225 and the first movable slider 230), the screw nut 240 may move (e.g., drop) downward past the second movable slider 220 due to the force of the second spring 216. For example, the second spring 216 may exert and/or apply a downward force on the screw nut 240 causing the screw nut 240 to move downward past the second movable slider 220.

Figure 4:
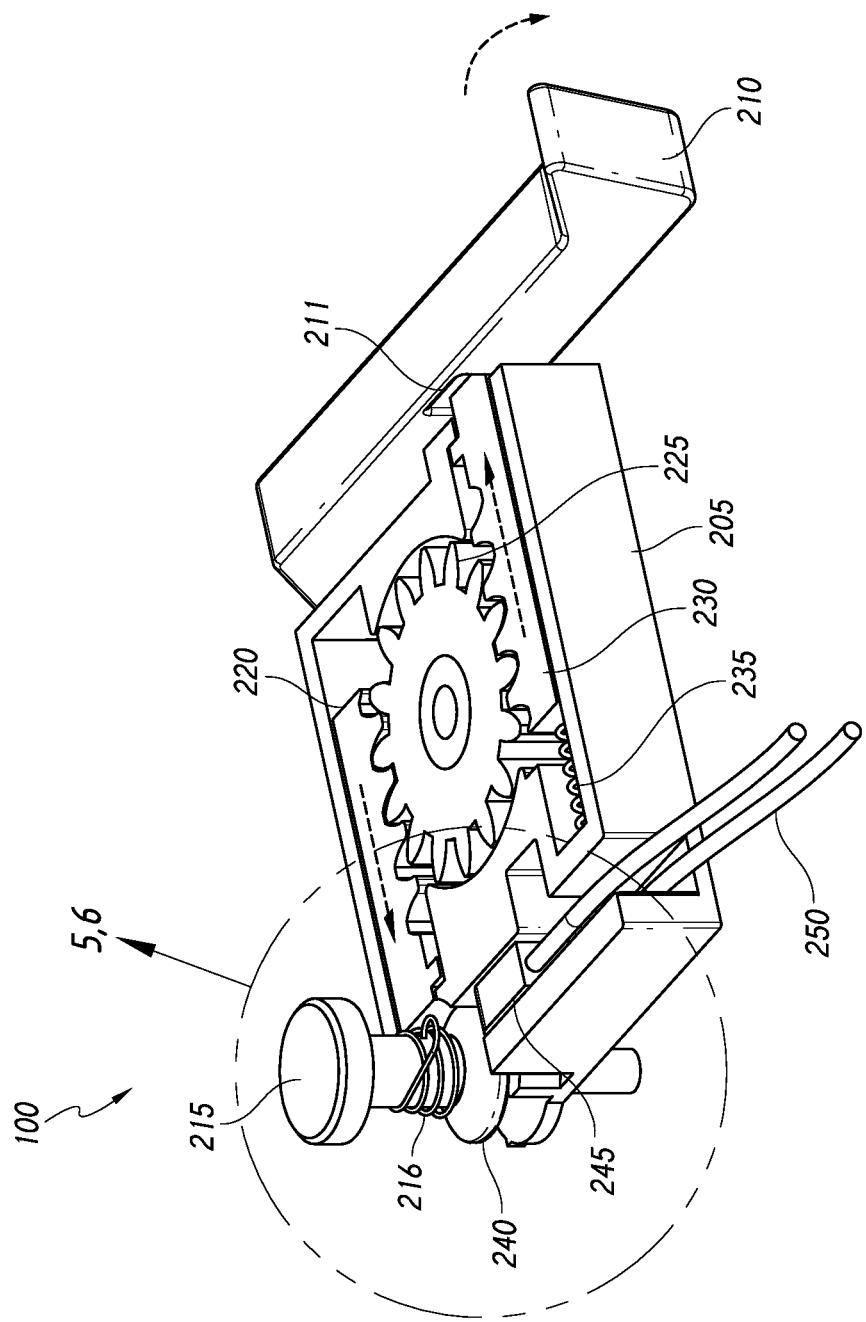
FIG. 4 is a diagram illustrating a cutaway perspective view of a line card ejector, according to one embodiment of the present disclosure.

FIG. 4 is a diagram illustrating a cutaway perspective view of a line card ejector, according to one embodiment of the present disclosure. As discussed above, the line card ejector 100 includes a second movable slider 220, a first movable slider 230, a gear 225, and a first spring 235 disposed within a housing 205. The second movable slider 220 and the first movable slider 230 are configured to cooperate with the gear 225 and the first spring 235 is configured to cooperate with the first movable slider 230. The line card ejector 100 also includes an ejection component 210 (e.g., a lever or a handle) that may be rotatable about an axis of the line card ejector 100. The ejection component 210 also includes an opening 211 configured to receive at least a portion of the it movable slider 230. The line card ejector 100 further includes a securing component 215, a sensor component 245, a second screw 216, and a screw nut 240 that may cooperate with the securing component 215 and the sensor component 245.

As discussed above, the ejection component 210 may be rotated downward in the direction illustrated by the dashed arrow and the ejection component 210 may cause the first movable slider 230 to move towards the left. As illustrated in FIG. 4, the ejection component 210 may be in a closed state where the ejection component may be full rotated downward (e.g., the ejection component may not be able to move further in a downward direction). When the ejection component 210 is in the closed state, the first moveable slider 230 may be placed in an extended state/configuration. For example, the first spring 235 may exert a force on the first movable slider 230 to cause the first movable slider 230 to move towards the right (as indicated by the dashed arrow of the first movable slider 230). This may cause at least a portion of the first movable slider 230 to protrude past the housing 205 of the line card ejector. The protruding portion of the first movable slider 230 may cooperate with the opening 211. For example, the protruding portion of the first movable slider 230 may be inserted into and/or may fit within the opening 211.

Figure 5:
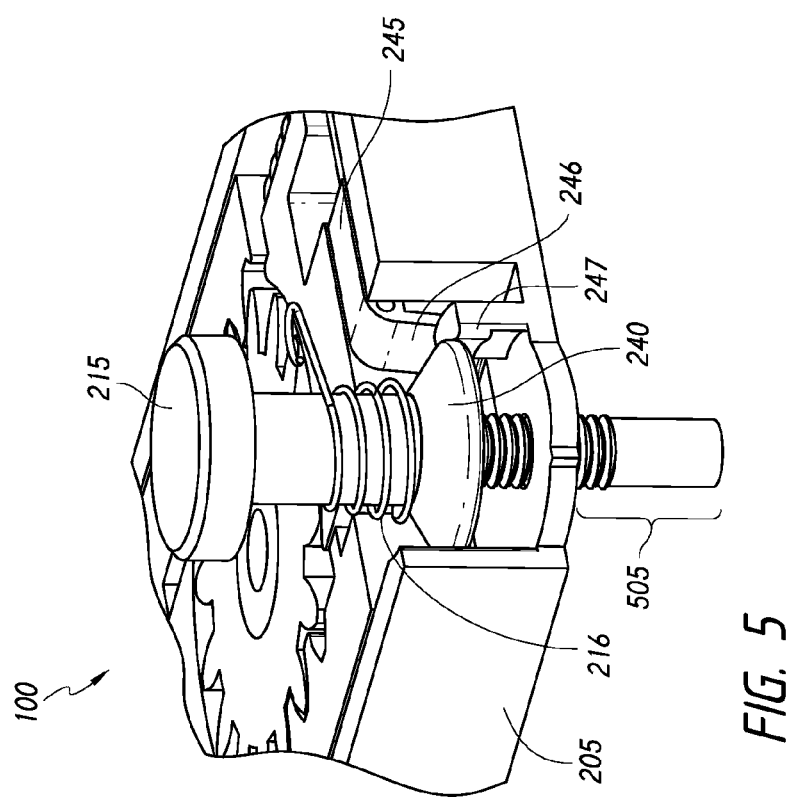
FIG. 5 is a diagram illustrating a cutaway rear perspective view of a portion of a line card ejector, according to one embodiment of the present disclosure.

FIG. 5 is a diagram illustrating a cutaway rear perspective view of a portion of a line card ejector 100, according to one embodiment of the present disclosure. As discussed above, the line card ejector 100 includes a securing component 215 (e.g., a captive screw), a sensor component 245, a spring second 216, and a screw nut 240, where the screw nut 240 may cooperate with the securing component 215 and the sensor component 245. The sensor component 245 includes a switch 246. As discussed above, the securing component 215 may be placed in different states/configurations (e.g., may transition between different states/configurations). For example, a user may manipulate the securing component 215 (e.g., may screw or unscrew the securing component 215) to place the securing component 215 in different states/configurations.

The securing component 215 may be in a second state/configuration (as discussed above). For example, portion 505 of the securing component 215 may be in an opening (e.g., a hole, an aperture, etc.) of the chassis of the network communication device. A user may manipulate the securing component 215 to place the securing component 215 in a first state/configuration such that the portion 505 is no longer in the opening of the chassis of the network communication device. A user may also manipulate the securing component 215 to place the securing component 215 in a third state/configuration (as discussed below). The securing component 215 may be placed in the second state/configuration as the securing component 215 is screwed into the hole in the chassis or as the securing component is unscrewed from the hole in the chassis (as discussed above).

As illustrated in FIG. 5, the screw nut 240 may be above a tab 247 (e.g., a protrusion, a snap, etc.). In one embodiment, the tab 247 may be part of the housing 205. In another embodiment, the tab 247 may be separate from the housing 205 and/or may be constructed using a different material than the housing 205. In one embodiment, the screw nut 240 may not contact and/or may not activate the switch 246 of the sensor component 245 (e.g., the switch 246 may be deactivated) when the screw nut 240 is above the tab 247. For example, securing component 215 and/or the second spring 216 may not exert a force on the screw nut 240 to push the screw nut 240 below the tab 247 when the securing component 215 is in the second state/configuration (or the first state/configuration). The screw nut 240 may not exert a force (e.g., may not push and/or contact) the switch 246 when the screw nut 240 is above the tab 247. In one embodiment, the tab may be an optional part of the line card ejector 100. For example, the tab 247 may not be part of the line card ejector 100.

As discussed above, the sensor component 245 may provide (e.g., transmit) a signal and/or other data to the line card when the switch 246 is deactivated. For example, the sensor component 245 may transmit a signal to the line card when the screw net 240 is above the tab 247 and is not exerting a force on the switch 246 (e.g., is not activating the switch 246). The signal and/or other data may indicate that the line card is about to be removed from the chassis (e.g., may indicate an imminent removal of the line card). The line card may perform one or more shutdown operations when the signal and/or other data is received from the sensor component 245. For example, the line card may close any open files in a memory of the line card and/or may finish any read and/or write operations to the memory.

Figure 6:
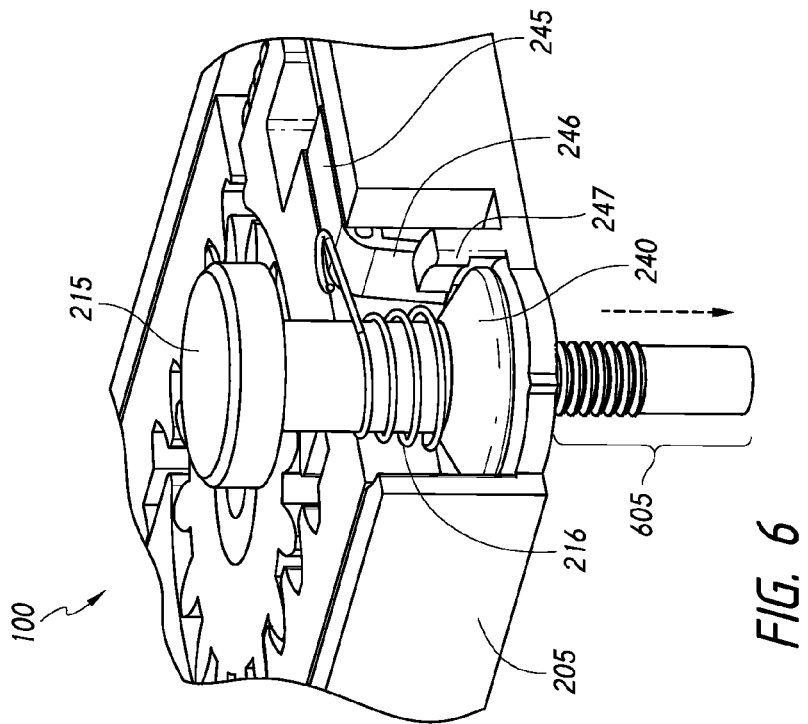
FIG. 6 is a diagram illustrating a cutaway rear perspective view of a portion of a line card ejector, according to one embodiment of the present disclosure.

FIG. 6 is a diagram illustrating a cutaway rear perspective view of a portion of a line card ejector 100, according to one embodiment of the present disclosure. As discussed above, the line card ejector 100 includes a securing component 215 (e.g., a captive screw), a sensor component 245, a second spring 216, and a screw nut 240 that may cooperate with the securing component 215 and the sensor component 245. The sensor component 245 includes a switch 246. The securing component 215 may be in a third state/configuration (as discussed above). For example, portion 605 of the securing component 215 may be in an opening (e.g., a hole, an aperture, etc.) of the chassis of the network communication device. The securing component 215 may be fully inserted into the opening in the chassis when the securing component 215 is in the third state/configuration. For example, as illustrated by securing component may be fully screwed downward, as illustrated by the dashed arrow in FIG. 6.

As illustrated in FIG. 6, the screw nut 240 may be below the tab 247 (e.g., a protrusion, a snap, etc.). In one embodiment, the screw nut 240 may contact and/or activate the switch 246 of the sensor component 245 (e.g., the switch 246 may be deactivated) when the screw nut 240 is below the tab 247. For example, securing component 215 and/or the second spring 216 may exert a force on the screw nut 240 to push the screw net 240 below the tab 247 when the securing component 215 is in the third state/configuration.

As discussed above, the sensor component 245 may not provide a signal and/or other data to the line card when the switch 246 is activated because there may be no indication that the line card is about to be removed from the chassis (e.g., there is no imminent removal of the line card). As the user manipulates the securing component 215 (e.g., as the user unscrews the securing component 215), the securing component 215 may be placed in the second state/configuration (as illustrated in FIG. 5) and the switch 246 may be deactivated (which may indicate the imminent removal of the line card as discussed above).

Figure 7:
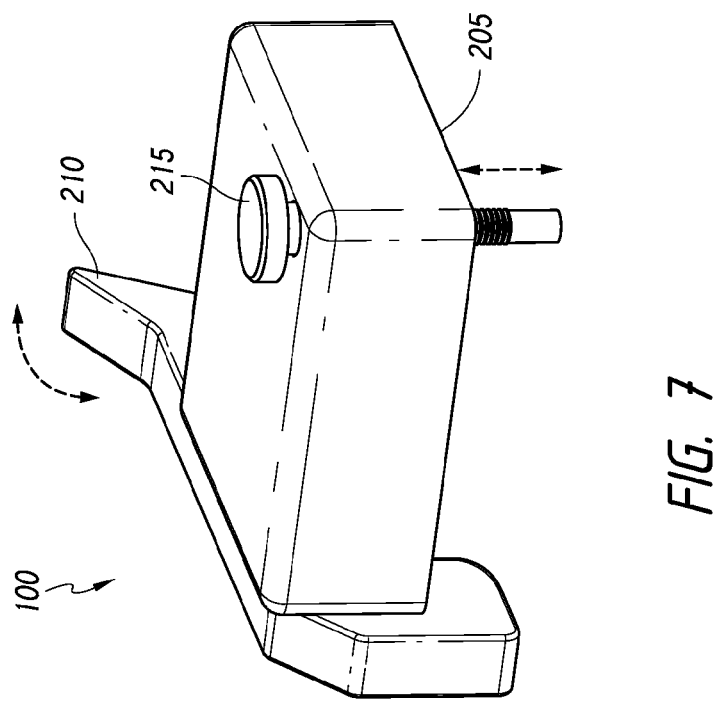
FIG. 7 is a diagram illustrating a rear perspective view of a line card ejector, according to one embodiment of the present disclosure.

FIG. 7 is a diagram illustrating a rear perspective view of a line card ejector 100, according to one embodiment of the present disclosure. As discussed above, the line card ejector 100 includes a housing 205, an ejection component 210, and a securing component 215. Also, as discussed above, the line card ejector 100 includes a second movable slider 220, a first movable slider 230, a gear 225, a first spring 235, a second spring 216, a screw nut 240, and a sensor component 245 disposed within the housing 205 (as discussed above). The ejection component 210 is rotatable about an axis (e.g., an X-axis of the line card ejector 100 as indicated by the dashed arrow. For example, a user may manipulate (e.g., push and/or pull) the ejection component 210 to rotate the ejection component 210 about the axis. The securing component 215 may be movable upwards and/or downwards (e.g., parallel to the Z-axis) as indicated by the dashed arrow. For example, a user may manipulate (e.g., screw and/or unscrew) the securing component 215 to move the securing component 215 upwards and/or downwards.

Figure 8:
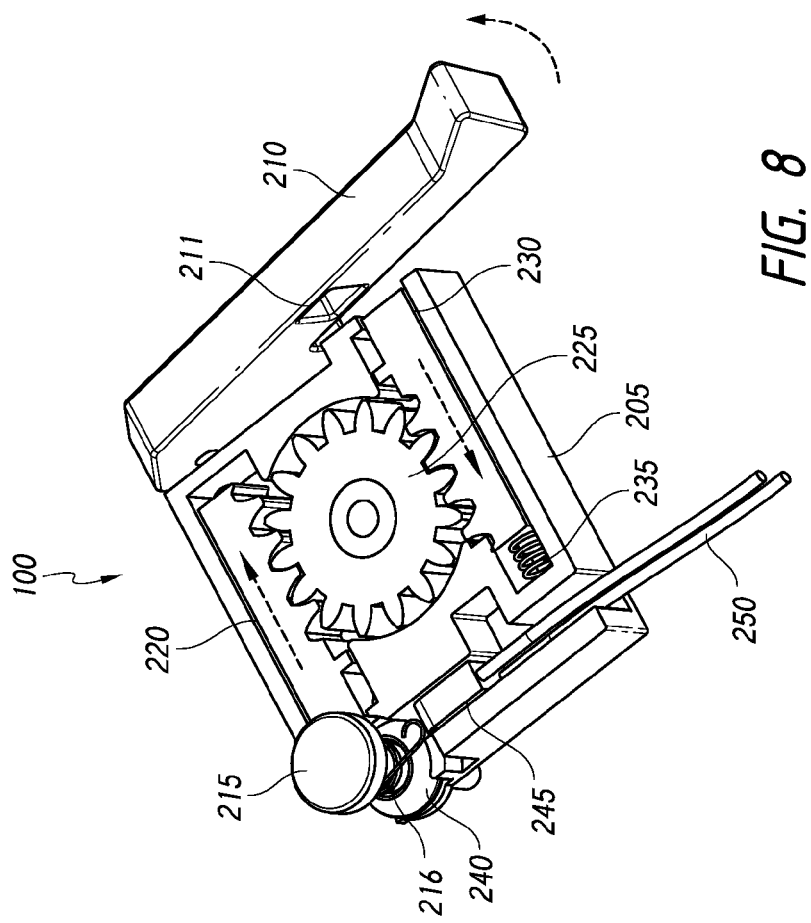
FIG. 8 is a diagram illustrating a cutaway perspective view of a line card ejector, according to one embodiment of the present disclosure.

FIG. 8 is a diagram illustrating a cutaway perspective view of a line card ejector 100, according to one embodiment of the present disclosure. As discussed above, the line card ejector 100 includes a second movable slider 220, a first movable slider 230, a gear 225, and a first spring 235 disposed within a housing 205. The second movable slider 220 and the first movable slider 230 are configured to cooperate with the gear 225 and the first spring 235 is configured to cooperate with the first movable slider 230. The line card ejector 100 also includes an ejection component 210 (e.g., a lever or a handle) that may be rotatable about an axis of the line card ejector 100. The ejection component 210 also includes an opening 211 configured to receive at least a portion of the first movable slider 230. The line card ejector 100 further includes a securing component 215, a second spring 216, a sensor component 245, and a screw nut 240 that may cooperate with the securing component 215 and the sensor component 245.

As illustrated in FIG. 8, the ejection component 210 may be rotated upward in the direction illustrated by the dashed arrow. The upward rotation of the ejection component 210 may facilitate the removal of the line card from the chassis. As discussed above, the first movable slider 230 may protrude past the housing 205 of the line card ejector 100 into the opening 211 of the ejection component 210 when the first movable slider 230 is in an extended state/configuration. As the ejection component 210 is rotated upward, the ejection component 210 may exert a force (e.g., may contact, push, etc.) against portion of the first movable slider 230 that protrudes past the housing 205 into the opening 211. The force of the upward rotation of the ejection component 210 may cause the first movable slider 230 to move towards the left (as indicated by the dashed arrow of the first movable slider 230) and may also compress the first spring 235 (as illustrated in FIG. 8). The movement of the first movable slider 230 towards the left may cause the gear 225 to rotate clockwise and may also cause the second movable slider 220 to move towards the right (as indicated by the dashed arrow of the second movable slider 220).

In one embodiment, the first movable slider 230 may return to an extended state/configuration when the ejection component 210 is rotated upwards. For example, referring to FIG. 2, when the ejection component 210 is rotated such that the ejection component 210 is no longer blocking the first movable slider 230 from transitioning to the extended state/configuration, the force exerted on the first movable slider 230 by the first spring 235 may cause the first movable slider 230 to transition to the extended state/configuration.

Figure 9:
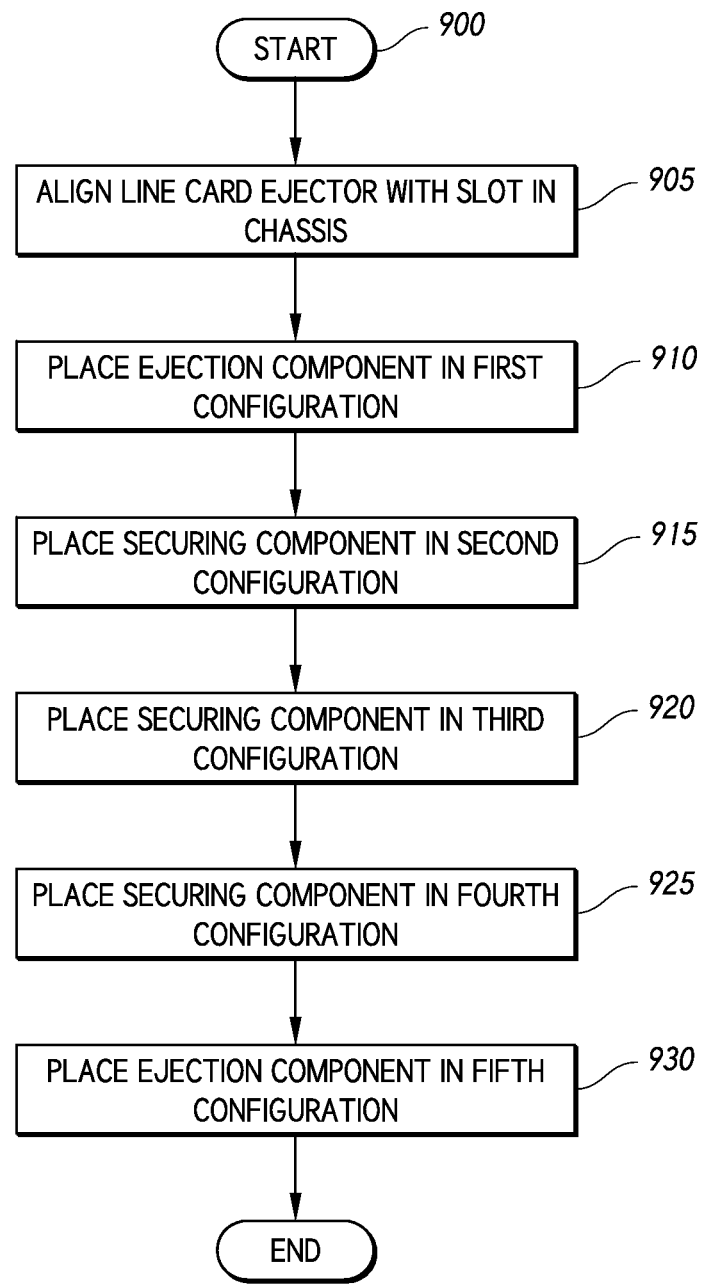
FIG. 9 is a flowchart representation of a method of operating a line card ejector having one or more features as described herein, according to one embodiment of the present disclosure.

FIG. 9 is a flowchart representation of a method 900 of operating a line card ejector having one or more features as described herein, according to one embodiment of the present disclosure. The method 900 begins at block 905 where a line card ejector 100 is aligned with a slot in a chassis of a network communication device. For example, referring to FIG. 1, a line card 110 may be inserted into the slot 131 in the chassis 132. The line card ejector 100 may be aligned with the line card 110 and/or the slot 131 in which the line card 110 is inserted. At block 910, the ejection component 210 of the line card ejector is placed in a first configuration. The first configuration may facilitate the insertion of the line card ejector and/or the line card. For example, referring to FIGS. 2-4, the ejection component 210 may be rotated downward until the first movable slider 230 is inserted into the opening 211 of the ejection component 210 (due to the force exerted on the first movable slider 230 by the first spring 235). The line card ejector may be attached to the chassis (e.g., via tabs, notches, grooves, and/or openings, etc., in the line card ejector and chassis) and may help to prevent the removal of the line card from the chassis. The securing component 215 is placed in a second configuration at block 915. For example, referring to FIG. 6, the securing component 215 may be moved downwards (e.g., screwed into an opening in the chassis of the network communication device) such that the screw nut 240 activates the switch 246 of the sensor component 245. After the line card ejector is attached to the chassis to help secure the line card in the slot of the chassis, the line card may operate normally.

When the line card is to be removed from the slot of the chassis, the securing component 215 is placed in a third configuration at block 920. For example, referring to FIG. 5, the securing component 215 may be moved upwards (e.g., unscrewed from the opening in the chassis of the network communication device) such that the screw nut 240 no longer activates the switch 246 of the sensor component 245 (e.g., the screw nut 240 is no longer in contact with the switch 246). The securing component 215 may still prevent the removal of the line card from the slot in the chassis when the securing component is in the third configuration. As discussed above, the sensor component may be configured to provide (e.g., transmit) a signal and/or other data to the line card to indicate that the removal of the line card from the chassis is imminent. The line card may perform one or more shutdown operations based on the signal and/or data received from the sensor component. For example, the line card may close any open files in a memory of the line card and/or may finish any read and/or write operations to the memory. In another example, the line card may power down one or more components (e.g., a circuit, a processor, etc.). At block 925, the securing component 215 may be placed in a fourth configuration. For example, the securing component may be fully unscrewed from the opening in the chassis. The securing component may allow the removal of the line card from the chassis when the securing component is in the fourth configuration. The ejection component 210 is placed in the fifth configuration at block 930. When the ejection component is placed in the fifth configuration, the line card ejector may be unattached (e.g., removed) from the chassis and the line card may also be removed from the chassis (e.g., the line card may be detached from a backplane of the network communication device).

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact. Also as used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Further as used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the disclosure provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An apparatus, comprising:
    a securing component configured to attach the apparatus to a chassis of a network communication device, prevent removal of a line card from the chassis when the securing component is in a secured state, and allow removal of the line card from the chassis when the securing component is in an at least partially unsecured state;
    an ejection component configured to facilitate insertion and removal of the line card from the chassis of the network communication device; and
    a sensor component configured to detect an imminent removal of the line card from the chassis of the network communication device, wherein the sensor component is communicatively coupled to the line card, and the sensor component is further configured to provide a signal to the line card in response to detecting the imminent removal of the line card when the securing component is transitioned from the secured state to the at least partially unsecured state, the signal indicating the imminent removal of the line card from the chassis of the network communication device and allowing the line card to perform one or more shutdown operations.

2. The apparatus of claim 1, wherein the apparatus further comprises a housing configured to cooperate with a first surface of the line card.

3. The apparatus of claim 2, wherein the ejection component comprises a handle configured to rotate about a first axis of the housing of the apparatus.

4. The apparatus of claim 2, wherein the securing component comprises a captive screw that traverses the housing of the apparatus.

5. The apparatus of claim 4, wherein at least a portion of the captive screw is configured to interface with an opening in the chassis.

6. The apparatus of claim 2, further comprising:
    a first movable slider disposed within the housing;
    a second movable slider disposed within the housing; and
    a gear disposed within the housing, wherein the gear is configured to cooperate with both the first movable slider and the second movable slider.

7. The apparatus of claim 6, wherein the first movable slider and the second movable slider are configured to move parallel to a first axis of the housing when the ejection component is moved.

8. The apparatus of claim 6, further comprising:
    a spring configured to exert a force on the first movable slider, the spring cooperating with a surface of the first movable slider.

9. The apparatus of claim 6, wherein at least a portion of the first movable slider is configured to interface with an opening in the ejection component.

10. The apparatus of claim 1, wherein the sensor component is configured to detect the imminent removal of the line card by detecting when the securing component is in the at least partially unsecured state.

11. The apparatus of claim 4, further comprising a screw nut cooperating with the captive screw.

12. The apparatus of claim 11, wherein the screw nut is configured to activate a switch of the sensor component when the securing component is in the secured configuration.

13. The apparatus of claim 11, wherein the screw nut is configured to deactivate a switch of the sensor component when the securing component is in the at least partially unsecured state.

14. An apparatus, comprising:
at least one processor mounted on a printed circuit board of a line card; and
a line card ejector comprising:
a securing component configured to attach the line card to a chassis of a network communication device, prevent removal of the line card from the chassis when the securing component is in a secured state, and allow removal of the line card from the chassis when the securing component is in an at least partially unsecured state;
an ejection component configured to facilitate insertion and removal of the line card from the chassis of the network communication device; and
a sensor component configured to detect an imminent removal of the line card from the chassis of the network communication device, wherein the sensor component is communicatively coupled to the line card, and the sensor component is further configured to provide a signal to the line card in response to detecting the imminent removal of the line card when the securing component is transitioned from the secured state to the at least partially unsecured state, the signal indicating the imminent removal of the line card from the chassis of the network communication device and allowing the line card to perform one or more shutdown operations.

15. A method, comprising:
aligning a line card ejector with a slot of a chassis of a network communication device, wherein the line card ejector comprises a securing component, an ejection component, and a sensor component;
placing the ejection component in first configuration, wherein the first configuration facilitates insertion of the line card into the slot of the chassis; and
placing the securing component in second configuration, wherein the second configuration prevents removal of the line card from the slot in the chassis, wherein the second configuration activates a switch of the sensor component; and
placing the securing component in a third configuration, wherein the third configuration deactivates the switch of the sensor component for detection of an imminent removal of the line card from the slot of the chassis, wherein the sensor component is configured to provide a signal to the line card in response to detecting the imminent removal of the line card when the switch of the sensor component is deactivated, the signal indicating the imminent removal of the line card from the chassis of the network communication device and allowing the line card to perform one or more shutdown operations.

16. The method of claim 15, further comprising:
placing the securing component in a fourth configuration, wherein the fourth configuration allows removal of the line card from the slot of the chassis; and
placing the ejection component in a fifth configuration, wherein the fifth configuration facilitates removal of the line card from the slot of the chassis.

* * * * *